US010659010B1

(12) United States Patent
Patel et al.

(10) Patent No.: US 10,659,010 B1
(45) Date of Patent: May 19, 2020

(54) RF OUTPUT DRIVER

(71) Applicant: QUALCOMM INCORPORATED, San Diego, CA (US)

(72) Inventors: Chirag Dipak Patel, San Diego, CA (US); Lai Kan Leung, San Marcos, CA (US); Ravi Sridhara, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/254,877

(22) Filed: Jan. 23, 2019

(51) Int. Cl.
  *H03K 5/00* (2006.01)
  *H03K 17/16* (2006.01)
  *H03K 19/00* (2006.01)
  *H03H 11/28* (2006.01)
  *H03K 17/687* (2006.01)
  *H04B 1/16* (2006.01)

(52) U.S. Cl.
  CPC ........... *H03H 11/28* (2013.01); *H03K 17/687* (2013.01); *H04B 1/16* (2013.01)

(58) Field of Classification Search
  CPC ......... H03H 11/28; H03K 17/687; H04B 1/16
  See application file for complete search history.

(56) References Cited

U.S. PATENT DOCUMENTS

| | | | | |
|---|---|---|---|---|
| 4,384,216 A * | 5/1983 | Pricer | .............. | H03K 19/09445 326/120 |
| 5,107,230 A * | 4/1992 | King | ................ | G01R 31/31905 324/750.3 |
| 7,486,135 B2 * | 2/2009 | Mu | .......................... | H03F 1/223 330/51 |
| 7,804,328 B2 * | 9/2010 | Pentakota | ............... | H03F 3/505 326/31 |
| 8,055,229 B2 * | 11/2011 | Huang | .................. | H04W 52/52 330/254 |
| 2004/0183772 A1 * | 9/2004 | Nakajima | ............ | G09G 3/2011 345/102 |
| 2012/0074987 A1 * | 3/2012 | Piepenstock | ..... | H03K 19/01852 327/108 |

* cited by examiner

*Primary Examiner* — Kenneth B Wells
(74) *Attorney, Agent, or Firm* — Smith Tempel Blaha LLC/Qualcomm

(57) ABSTRACT

An RF driver circuit may include a wideband output impedance matching and gain circuit, a wideband input impedance matching and gain circuit, and a summer configured to sum the outputs of the wideband output impedance matching and gain circuit and wideband input impedance matching and gain circuit. The wideband output impedance matching and gain circuit and wideband input impedance matching and gain circuit may collectively provide the gain of the RF driver circuit. The wideband output impedance matching circuit may have a source follower configuration. The wideband input impedance matching circuit may have a common gate configuration. Controllable bias voltages may be used to maintain a constant gain and interface impedances in multiple modes of operation.

24 Claims, 13 Drawing Sheets

RF OUTPUT DRIVER

FIELD

The present disclosure relates to wireless communications, and more particularly, to radio frequency driver circuits.

BACKGROUND

Radio frequency (RF) transceivers may comprise integrated circuit chips with RF connections or inter-chip links between them. An RF output driver circuit is commonly employed to provide the RF signal on the inter-chip link. In millimeter-wave (mmw) 5G transceivers, such an RF inter-chip link may operate at high frequencies, such as, for example, 10-20 gigahertz (GHz), and commonly needs very wide bandwidth, such as, for example, 6-12 GHz. An RF inter-chip link in a receiver also commonly needs to carry high power. Impedance matching is commonly employed for robust performance of both chips. The impedance matching may be passive or active.

Passive impedance matching techniques are commonly characterized as either tunable or wideband. Both tunable passive impedance matching and wideband passive impedance matching may incur a chip area penalty and introduce significant temperature sensitivity. Tunable passive impedance matching may reduce bandwidth. Wideband passive impedance matching may increase loss. Also, both tunable and wideband impedance matching may carry a trade-off between mismatch and linearity over wide bandwidths or tuning ranges.

Active impedance matching may also be employed. An active impedance matching circuit may be based on, for example, a source follower transistor configuration. However, a conventional source follower configuration may adversely impact linearity and power consumption. Also, an RF output driver based on a source follower may present a high impedance to preceding amplification stages, resulting in high voltage swings.

It would be desirable to provide an RF output driver having a low input impedance and matched output impedance, low current, and/or good linearity.

SUMMARY

Various implementations of systems, methods, and apparatuses within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that relative dimensions of elements depicted in the drawing figures may not be to scale.

In one aspect of the disclosure, a radio frequency (RF) driver circuit may include a first transistor and a second transistor. The first transistor may have a source terminal coupled to a driver circuit input and a drain terminal coupled to a driver circuit output. The second transistor may have a source terminal coupled to the driver circuit output and a gate terminal coupled to the driver circuit input.

In another aspect of the disclosure, an RF circuit may include a wideband output impedance matching and gain circuit having an input connected to a circuit input, and a wideband input impedance matching and gain circuit having an input connected to the circuit input. The wideband output impedance matching and gain circuit may provide a portion of the total gain of the RF circuit, and the wideband input impedance matching and gain circuit may provide the remainder of the total gain. The RF circuit may further include a summer defining the circuit output and configured to sum an output of the wideband input impedance matching and gain circuit and an output of the wideband output impedance matching and gain circuit.

In still another aspect of the disclosure, an RF driver circuit may include a plurality of circuit pairs and a bias voltage controller. Each circuit pair may include a source follower transistor and a common gate transistor. The common gate transistor may have a source terminal coupled to the driver circuit input and a drain terminal coupled to the driver circuit output. The source follower transistor may have a source terminal coupled to the driver circuit output and a gate terminal coupled to the driver circuit input. The bias voltage controller may be configured to couple a bias voltage in a selectable manner to each common gate transistor in response to an operating condition.

In yet another aspect of the disclosure, a method for driving an RF inter-chip link may include selectably coupling a bias voltage combination to a plurality of circuit pairs based on an operating condition. Each circuit pair may include a source follower transistor and a common gate transistor. The common gate transistor may have a source terminal coupled to a driver circuit input and a drain terminal coupled to a driver circuit output. The source follower transistor may have a source terminal coupled to the driver circuit output and a gate terminal coupled to the driver circuit input.

In a still further aspect of the disclosure, an apparatus for driving an RF inter-chip link may include a plurality of circuit pairs and means for selectably coupling a bias voltage combination to the plurality of circuit pairs. Each circuit pair may include a source follower transistor and a common gate transistor. The source follower transistor may have a source terminal coupled to an output of the apparatus and a gate terminal coupled to an input of the apparatus. The common gate transistor may have a source terminal coupled to the input and a drain terminal coupled to the output.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described herein may be performed in an order different from that described, and various steps may be added, omitted, or combined. Also, features described with respect to some examples may be combined in other examples.

Figure 1:
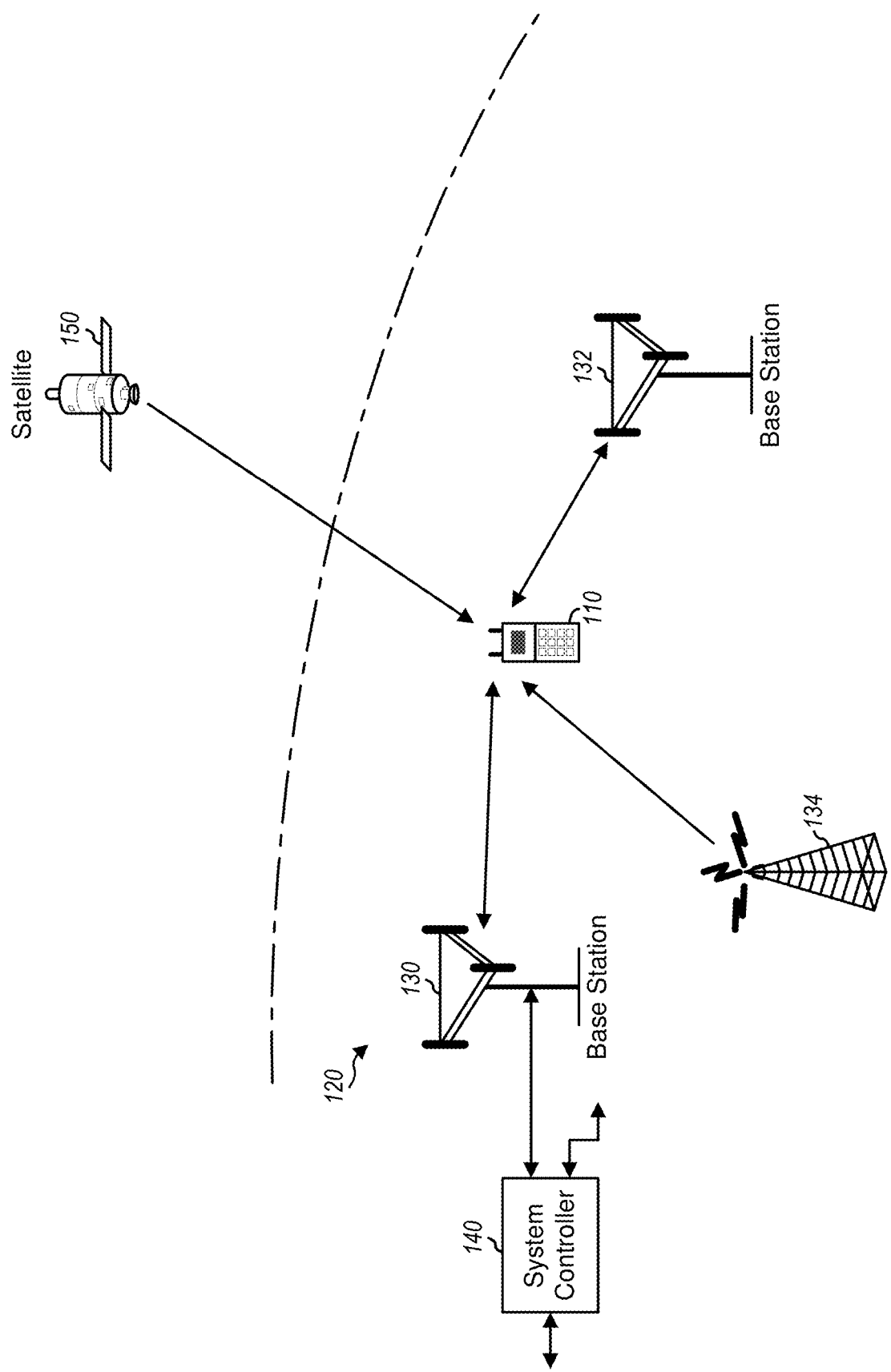
FIG. 1 is a block diagram of an example of a wireless communication system, in accordance with various aspects of the present disclosure.

FIG. 1 is a diagram showing a wireless device 110 in a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. More generally, such a wireless communication system may include any number of such base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate bidirectionally with base stations 130 and 132, with one or more access points, and/or with one or more other wireless or mobile devices. Wireless device 110 may receive signals from broadcast stations (e.g., a broadcast station 134). Wireless device 100 may further receive signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, 5G, etc.

Wireless device 110 may support carrier aggregation, for example as described in one or more LTE or 5G standards. For example, wireless device 110 may be configured to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. Low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz in some standards and may include one or more carriers. Each carrier may cover up to 20 MHz in LTE, for example. LTE Release 11 supports 35 bands, which are referred to as LTE/UMTS bands and are listed in 3GPP TS 36.101. Wireless device 110 may be configured with up to five carriers in one or two bands in LTE Release 11 in some embodiments.

Figure 2:
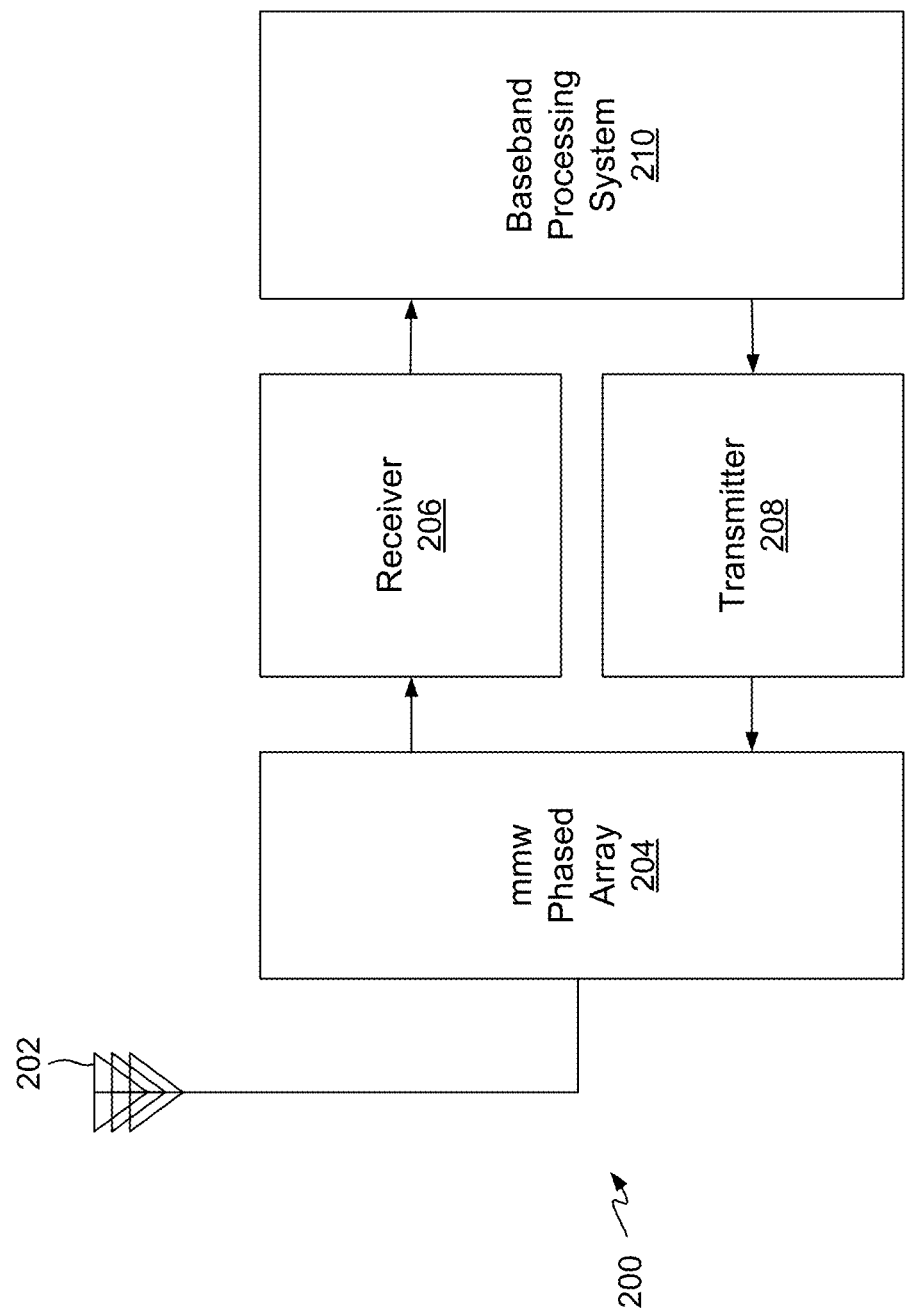
FIG. 2 is a block diagram of a wireless transceiver device, in accordance with various aspects of the present disclosure.

FIG. 2 is a block diagram of a wireless device 200 in which the exemplary circuits, devices, systems, methods, etc., of the present disclosure may be implemented. Wireless device 200 may be an example of above-described wireless device 110 (FIG. 1). For example, wireless device 200 may be a 5G smartphone, WLAN (e.g., WiGig) router, or other device. Wireless device 200 may include an antenna array 202, a millimeter-wave (mmw) phased array 204, a receiver portion 206, a transmitter portion 208, and a baseband processing system 210. In some embodiments, the antenna array 202 may be integrated with the phased array 204, for example as described below with respect to FIG. 3.

Figure 3:
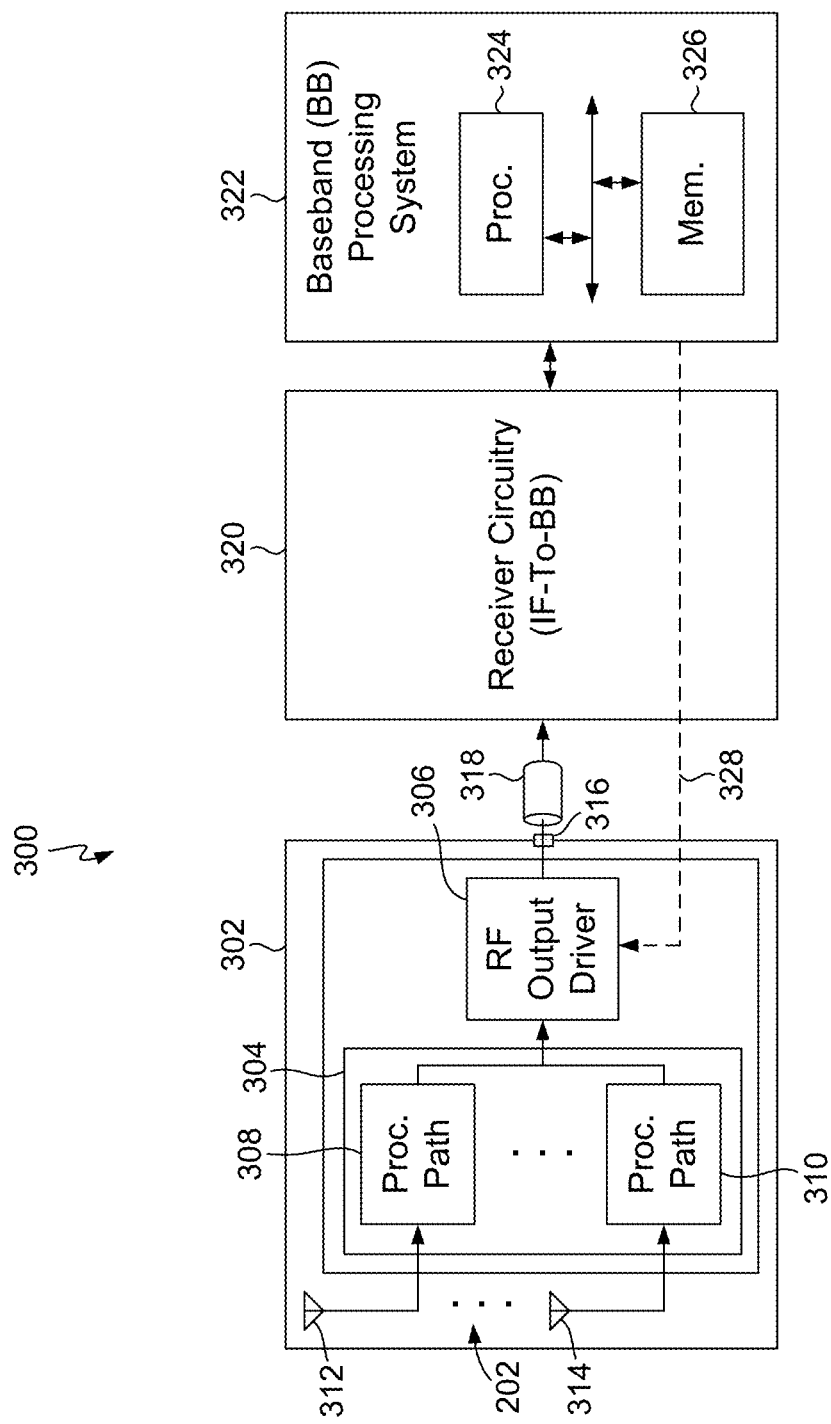
FIG. 3 is a block diagram of a receiver-related portion of a wireless transceiver device, in accordance with various aspects of the present disclosure.

FIG. 3 is a block diagram of a receiver-related portion 300 of wireless device 200 (FIG. 2). Phased array 204 (FIG. 2) may be implemented in an integrated circuit chip 302. Chip 302 may include phased array circuitry 304 and an RF output driver circuit 306. Phased array circuitry 304 may include a plurality of phased array processing paths 308 through 310. Although for purposes of clarity only two phased array processing paths 308 and 310 are individually shown, further phased array processing paths that may be included are indicated by the ellipsis symbol (" . . . ") between phased array processing paths 308 and 310. A reference herein to phased array processing paths "308-310" includes all such further phased array processing paths. Antenna array 202 (FIG. 2) may be implemented on chip 302 as illustrated, or in other embodiments may be external to chip 302. Antenna array 202 may comprise a plurality of antennas 312 through 314. Although for purposes of clarity only two antennas 312 and 314 are individually shown, further antennas that may be included are indicated by the ellipsis symbol (" . . . ") between antennas 312 and 314. The plurality of antennas 312-314 may support multiple-input/ multiple-output (MIMO) technology. The use of MIMO technology enables the wireless device 200 to exploit the spatial domain to support spatial multiplexing, beamforming, and diversity. In some embodiments, each antenna 312-314 is coupled to a corresponding (respective) processing path 308-310.

The RF output driver 306 may be configured to receive signals from the combined outputs of phased array processing paths 308-310. In a manner described below in further detail, RF output driver 306 may provide an output signal to a physical output port 316 of chip 302. An end of an inter-chip link 318, such as a cable, may be connected to physical output port 316. The other end of inter-chip link 318 may be connected to a physical input port (not shown) of another chip, such as a chip containing receiver circuitry 320. In the illustrated embodiment, phased array circuitry 304 converts received RF signals to a lower frequency. Although the lower frequency may still be considered to be within the RF spectrum, the converted signals may be referred to for purposes of clarity herein as intermediate frequency (IF) signals. For example, the phased array circuitry 304 may be configured to downconvert signals in the range of approximately 24-40 GHz (e.g., in certain 5G embodiments) to an intermediate frequency of approximately 10-20 GHz for transmission over the inter-chip link 318. In some embodiments, such as in some WLAN embodiments (e.g., in standards referred to as 60 GHz WiFi or WiGig), the phased array circuitry 304 may be configured to downconvert signals in a 60 GHz band to an intermediate frequency. Receiver circuitry 320 may perform further frequency downconversion by converting the IF signals to baseband (e.g., digital) signals, as well as other receiver-related functions understood by one of ordinary skill in the art. In other embodiments, phased array circuitry 304 may process received signals without downconverting them, and receiver circuitry 320 may convert RF signals received from the chip 302 to baseband.

Baseband processing system 322 may further process the baseband signals. Although not shown for purposes of clarity, baseband processing system 322 may include processors 324, memories 326, etc., configured to process information under control of software, firmware or other logic. Although similarly not shown for purposes of clarity, baseband processing system 322 may include user-interface related elements, such as a touch-screen display, microphone, speaker, etc. Among other functions, baseband processing system 322 may control aspects of the operation of RF output driver 306, as conceptually indicated by the arrow 328.

While the transmitter 208 is illustrated in FIG. 2 as being separate from the receiver 206, the transmitter 208 may be partially or wholly integrated with the receiver 206. In some embodiments, elements configured for transmission of RF signals are implemented on the chip 302 and/or within the circuitry 304. In some such embodiments, the transmission elements are configured to share the antennas 312-314 and/or the output port 316 and inter-chip link 318 with the receive components of chip 302 described above. For example, a respective transmit path corresponding to each processing path 308-310 may be implemented in the circuitry 304, and each transmit path may be coupled to a corresponding (respective) antenna 312-314. Each transmit path may be coupled to the output port 316 via one or more circuit components, and may be configured to upconvert IF signals received from transmit circuitry—which may, for example, be integrated with the receiver circuitry 320—to RF signals for transmission by one of the antennas 312-314.

In other embodiments, the transmitter 208 is implemented on chips different from the chip 302 and the receiver 320 or is otherwise implemented separate from the receiver 206.

Figure 4:
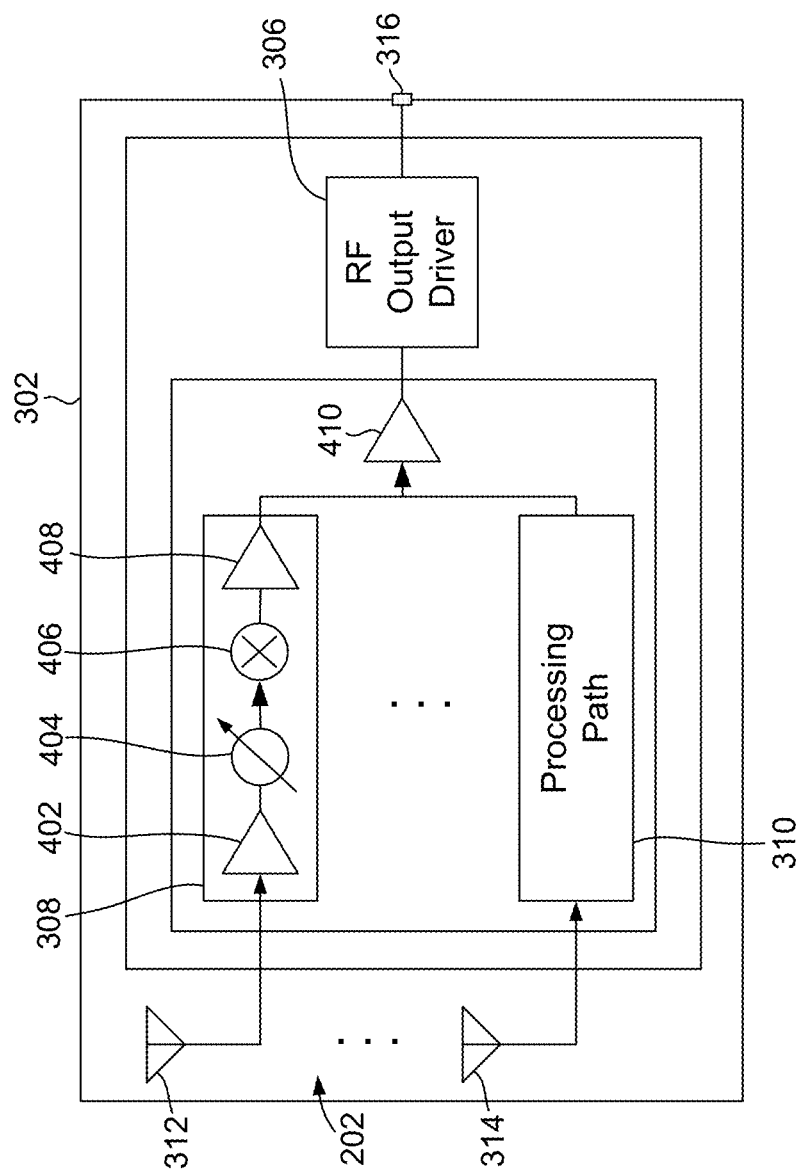
FIG. 4 is a block diagram of a portion of a phased array chip having an RF output driver, in accordance with various aspects of the present disclosure.

FIG. 4 is block diagram of chip 302 (as illustrated in FIG. 3), showing phased array processing paths 308-310 in further detail. Each of phased array processing paths 308-310 may include, for example, an input amplifier 402, a phase shifter 404, a mixer 406, and an output amplifier 408. Another amplifier 410 may couple the combined outputs of phased array processing paths 308-310 to an input of RF output driver 306. The output of RF output driver 306 may be directly connected to physical output port 316.

Figure 5:
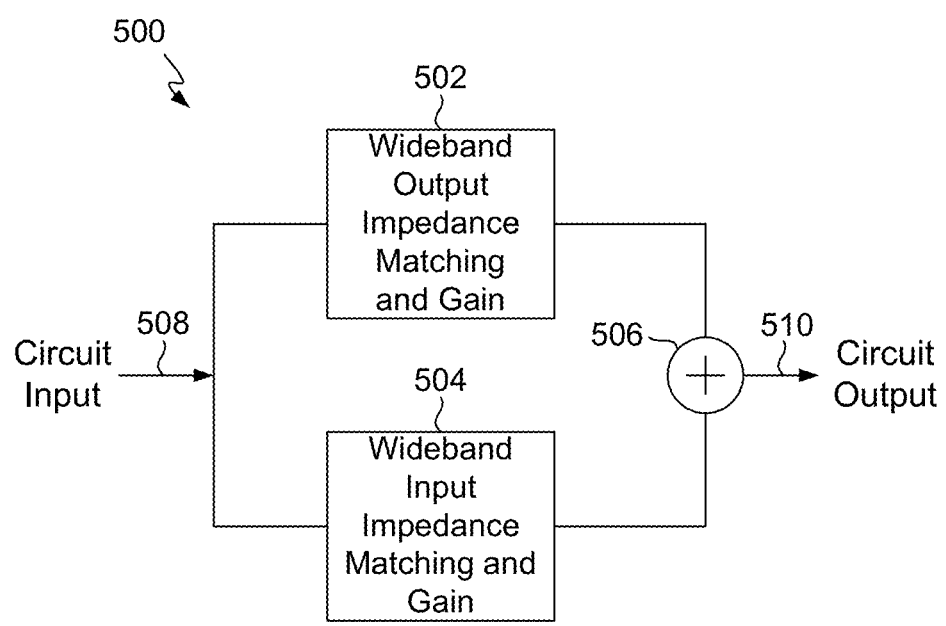
FIG. 5 is a block diagram of an RF output driver, in accordance with various aspects of the present disclosure.

FIG. 5 is a block diagram of an RF output driver 500, which may be an example of RF output driver 306 (FIGS. 3-4). The RF output driver 500 may comprise a wideband output impedance matching and gain circuit 502, a wideband input impedance matching and gain circuit 504, and a summer 506. An input of wideband output impedance matching and gain circuit 502 may be coupled to an input 508 of the RF output driver 500. Similarly, an input of wideband input impedance matching and gain circuit 504 may be coupled to the input 508. Summer 506 may define or otherwise provide an output 510 of the RF output driver 500. Summer 506 may be configured to sum an output of wideband output impedance matching and gain circuit 502 and an output of wideband input impedance matching and gain circuit 504. Wideband output impedance matching and gain circuit 502 may provide a portion of the total gain of RF output driver 500, and wideband input impedance matching and gain circuit 504 may provide the remainder of the total gain. Although the term "total gain" is used herein for purposes of clarity to distinguish that gain from the provided portions of the total gain, it should be understood that the total gain may be one, i.e., unity gain, with no amplification. In other embodiments, the total gain may be greater than one or less than one.

Figure 6:
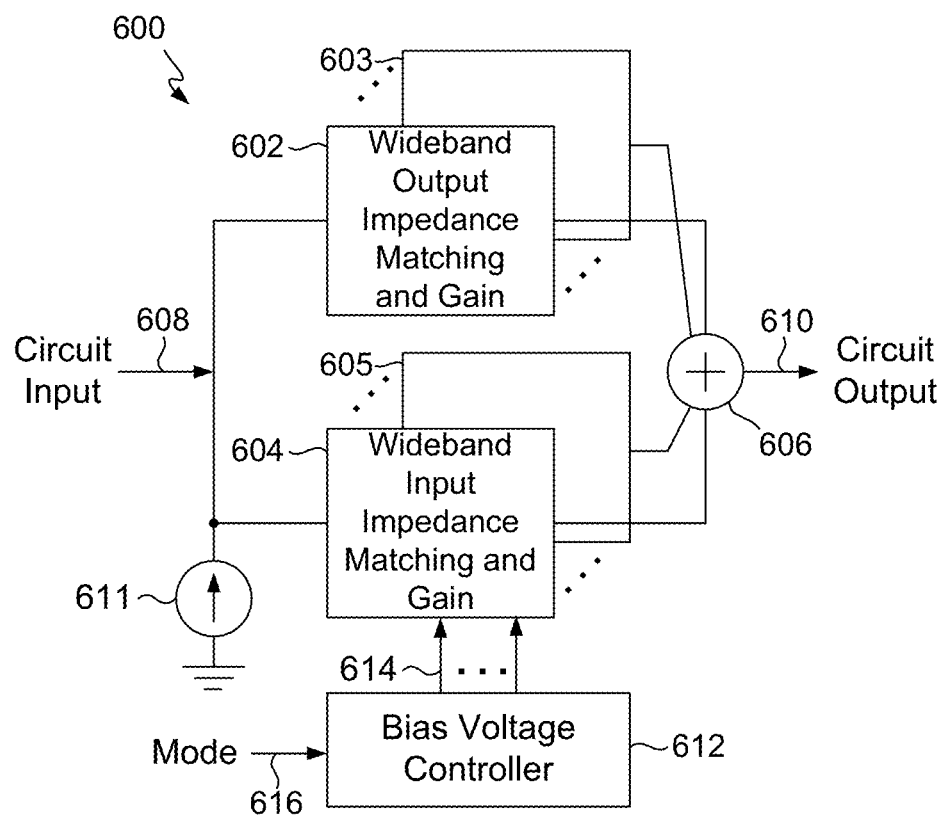
FIG. 6 is similar to FIG. 5, illustrating multiple instances or slices of the RF output driver with controllable bias voltages.

FIG. 6 is a block diagram of an RF output driver 600, which may be an example of RF output driver 306 (FIGS. 3-4) or RF output driver 500 (FIG. 5). The RF output driver 600 may include a first wideband output impedance matching and gain circuit 602 through an Nth wideband output impedance matching and gain circuit 603, where N is an integer greater than or equal to two. Although for purposes of clarity only the first wideband output impedance matching and gain circuit 602 and the Nth wideband output impedance matching and gain circuit 603 are individually shown, further wideband output impedance matching and gain circuits that may be included are indicated by the ellipsis symbol (" . . . ") between wideband output impedance matching and gain circuits 602 and 603. A reference to wideband output impedance matching and gain circuits "602-603" includes all such further wideband output impedance matching and gain circuits, for a total of N wideband output impedance matching and gain circuits 602-603.

The RF output driver 600 may further include a first wideband input impedance matching and gain circuit 604 through an Nth wideband input impedance matching and gain circuit 605. Although for purposes of clarity only the first wideband input impedance matching and gain circuit 604 and the Nth wideband input impedance matching and gain circuit 605 are individually shown, further wideband input impedance matching and gain circuits that may be included are indicated by the ellipsis symbol (" . . . ") between wideband input impedance matching and gain circuits 604 and 605. A reference to wideband input impedance matching and gain circuits "604-605" includes all such further wideband input impedance matching and gain circuits, for a total of N wideband input impedance matching and gain circuits 604-605.

The RF output driver 600 may still further include a summer 606. An input of each of wideband output impedance matching and gain circuits 602-603 may be coupled to an input 608 of the RF output driver 600. Similarly, an input of each of wideband input impedance matching and gain circuits 604-605 may be coupled to the input 608. Summer 606 may define or otherwise provide an output 610 of the RF output driver 600. Summer 606 may be configured to sum the outputs of all N wideband output impedance matching and gain circuits 602-603 and the outputs of all N wideband input impedance matching and gain circuits 604-605. A current source 611 may be included in RF output driver 600. For example, current source 611 may be coupled to input 608. Effects of such a current source 611 are described below with regard to examples shown in FIGS. 7-10.

Each of wideband output impedance matching and gain circuits 602-603 corresponds to exactly one of wideband input impedance matching and gain circuits 604-605. A set of one of wideband output impedance matching and gain circuits 602-603 and the corresponding one of wideband input impedance matching and gain circuits 604-605 may be referred to for convenience as a "slice" or a "circuit pair." In each circuit pair, the total gain of RF output driver 600 may be provided by the combined contributions of the corresponding ones of wideband output impedance matching and gain circuits 602-603 and wideband input impedance matching and gain circuits 604-605.

The RF output driver 600 may also include a controller 612 configured to control or adjust operation of the slices, for example by providing control signals 614 based on an input signal 616. The controller 612 is illustrated in FIG. 6 as a bias voltage controller. In some embodiments (as described below in further detail), wideband input impedance matching and gain circuits 604-605 may be controlled by controlling their bias voltages (614). For example, by controlling their bias voltages, zero or more of wideband input impedance matching and gain circuits 604-605 may be selected to turn on while zero or more others of wideband input impedance matching and gain circuits 604-605 may be selected to turn off. Bias voltage controller 612 may control these bias voltages based on one or more operating conditions in the device (e.g., wireless device 200) in which RF output driver 600 is included. For example, such operating conditions may include conditions relating to received signal strength. In such an example, when wireless device 200 determines that a received signal strength is low, wireless device 200 may reduce bias voltages to thereby reduce current consumption, because linearity requirements may be less stringent. Conversely in such an example, when wireless device 200 determines that a received signal is higher strength, wireless device 200 may increase bias voltages to thereby improve linearity. Bias voltage controller 612 may operate in this manner in response to the input signal 616, which is illustrated in FIG. 6 as a Mode control signal. Input signal 616 may be provided by, for example, baseband processing system 210 (FIG. 2) or 322 (FIG. 3). Mode control signal 616 may be an example of a control signal represented by arrow 328 in FIG. 3.

Figure 7A:
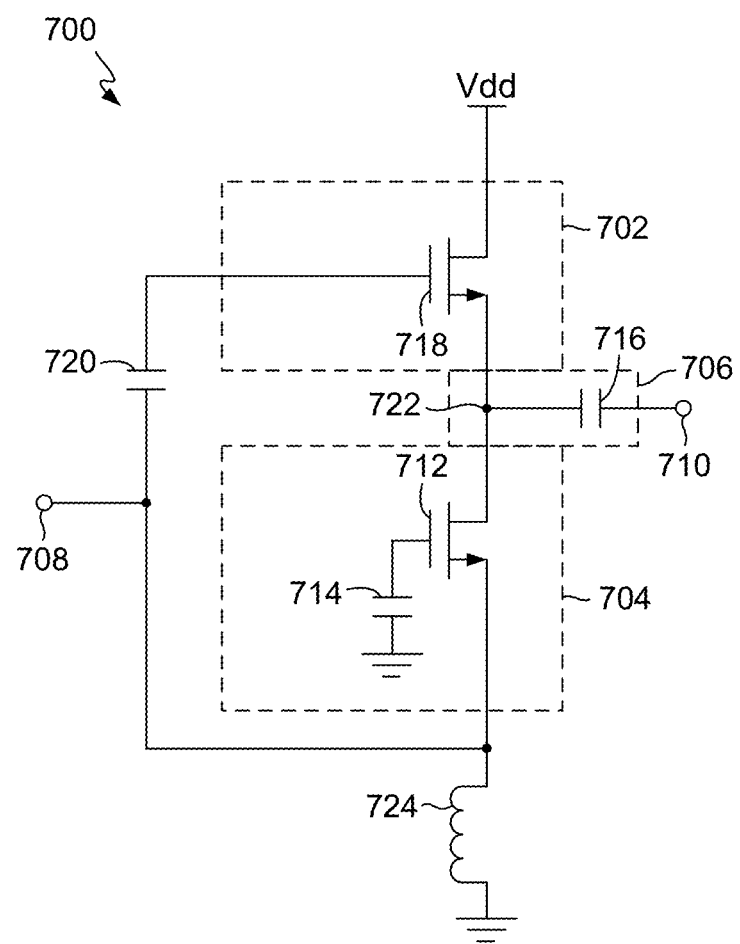
FIG. 7A is a schematic circuit diagram of an example of the RF output driver of FIG. 5, in accordance with various aspects of the present disclosure.

FIG. 7A is a schematic circuit diagram of an RF output driver 700. The RF output driver 700 may be an example of RF output driver 306 (FIGS. 3-4), RF output driver 500 (FIG. 5), or RF output driver 600 (FIG. 6). For purposes of clarity, bias voltages (i.e., bias voltage connections) and a bias voltage controller are not shown but may be included.

The RF output driver 700 may include a first transistor 712, e.g., a metal-oxide semiconductor field-effect transistor (MOSFET) having a common gate configuration. The gate terminal of first transistor 712 may be coupled to ground via a first alternating current (AC) coupling capacitor 714. The source terminal of first transistor 712 may be coupled to an input 708 of the RF output driver 700. The drain terminal of first transistor 712 may be coupled to an output 710 of the RF output driver 700 via a direct current (DC) blocking capacitor 716. First transistor 712 (or first transistor 712 in combination with AC coupling capacitor 714) may define an exemplary wideband input impedance matching and gain circuit 704. Nevertheless, in other embodiments (not shown), such a wideband input impedance matching and gain circuit may include other circuit elements in addition to a common gate transistor, such as other transistors, other capacitors, etc.

RF output driver 700 may also include a second transistor 718, e.g., a MOSFET having a source follower (e.g., common drain) configuration. The drain terminal of second transistor 718 may be coupled to a supply voltage (e.g., Vdd). The gate terminal of second transistor 718 may be coupled to the input 708 via a second AC coupling capacitor 720. The source terminal of second transistor 718 may be coupled to the output 710 via DC blocking capacitor 716. Note that the source terminal of second transistor 718 and the drain terminal of first transistor 712 may be coupled together at a node 722, which may be coupled to DC blocking capacitor 716. Node 722 (or node 722 in combination with DC blocking capacitor 716) may define an exemplary summer 706. Nevertheless, in other embodiments (not shown), such a summer may include other circuit elements. Second transistor 718 may define an exemplary wideband output impedance matching and gain circuit 702.

The RF output driver 700 may further include an inductor 724 configured to serve as an RF current source. Inductor 724 may be an example of current source 611 in FIG. 6. Although in the embodiment illustrated in FIG. 7A inductor 724 may be an example of current source 611, in other embodiments (not shown) a transistor or other device may be an example of current source 611. One terminal of inductor 724 may be coupled to the source terminal of first transistor 712, and the other terminal of inductor 724 may be coupled to ground. Second transistor 718 may recycle or otherwise use the current provided by first transistor 712. That is, although both the first and second transistors 712 and 718 recycle a current between them, the current may more strongly be a function of the gate voltage of first transistor 712 than the gate voltage of second transistor 718.

Figure 7B:
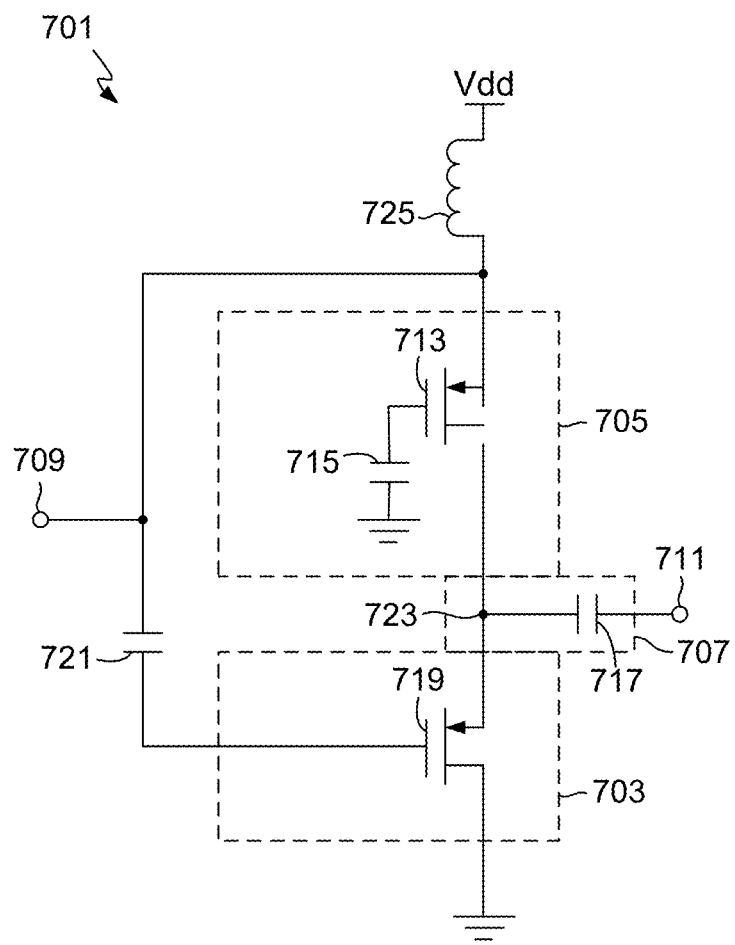
FIG. 7B is similar to FIG. 7A, showing an alternative transistor structure.

While RF output driver 700 may have NMOS transistors as illustrated in FIG. 7A, an alternative RF output driver 701 providing equivalent functionality may have PMOS transistors, as illustrated in FIG. 7B. Accordingly, RF output driver 701 may include a first transistor 713 having a common gate configuration. First transistor 713 may have a P-channel or PMOS structure, in contrast with above-described first transistor 712 (FIG. 7A) which may have an N-channel or NMOS structure. The gate terminal of first transistor 713 may be coupled to ground via a first AC coupling capacitor 715. The source terminal of first transistor 713 may be coupled to an input 709 of the RF output driver 701 and to a terminal of an inductor 725 or other current source. The other terminal of inductor 725 may be coupled to a supply voltage (e.g., Vdd). The drain terminal of first transistor 713 may be coupled to an output 711 of RF output driver 701 via a direct current (DC) blocking capacitor 717. First transistor 713 (or first transistor 713 in combination with AC coupling capacitor 715) may define an exemplary wideband input impedance matching and gain circuit 705.

RF output driver 701 may also include a second transistor 719 having a source follower (e.g., common drain) configuration. The drain terminal of second transistor 719 may be coupled to ground. The gate terminal of second transistor 719 may be coupled to input 709 via an AC coupling capacitor 721. The source terminal of second transistor 719 may be coupled to output 711 via DC blocking capacitor 717. The source terminal of second transistor 719 and the drain terminal of first transistor 713 may be coupled together at a node 723, which may be coupled to DC blocking capacitor 717. Node 723 (or node 723 in combination with DC blocking capacitor 717) may define an exemplary summer 707. Second transistor 719 may define an exemplary wideband output impedance matching and gain circuit 703.

Figure 8:
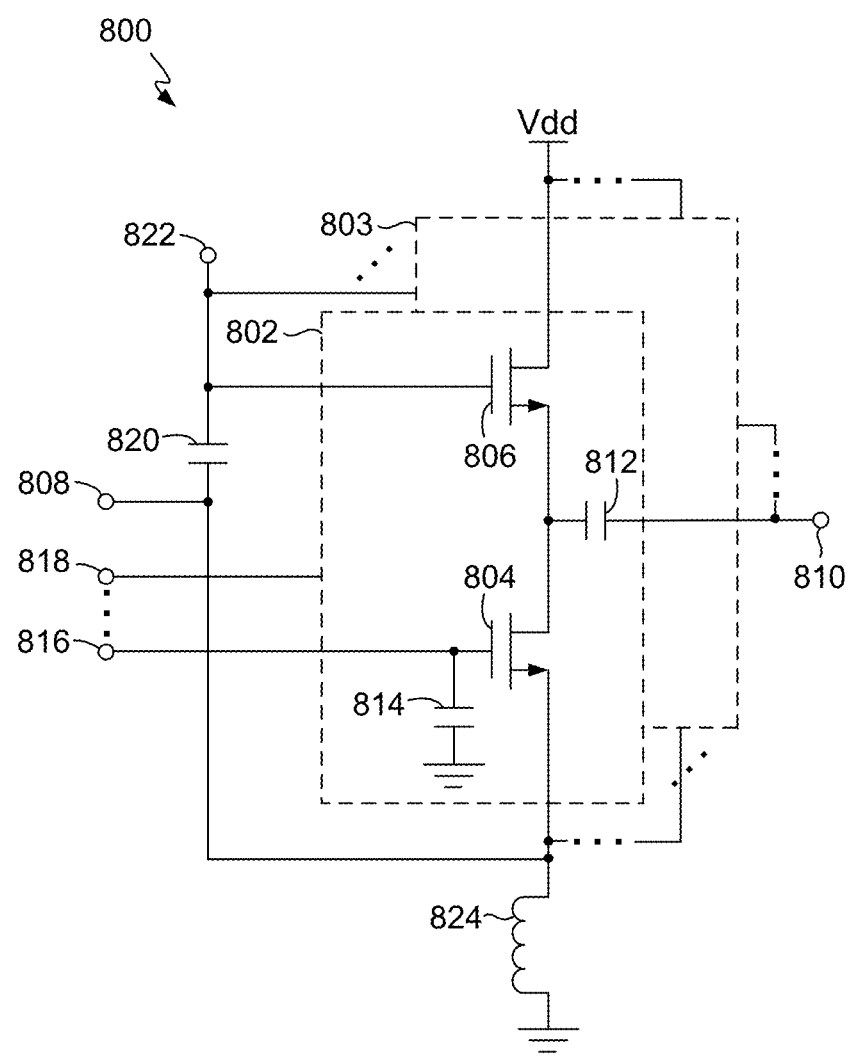
FIG. 8 is a schematic circuit diagram of another, multi-slice example of the RF output driver of FIG. 5, in accordance with various aspects of the present disclosure.

FIG. 8 is a schematic circuit diagram of an RF output driver 800. The RF output driver 800 may be an example of RF output driver 306 (FIGS. 3-4), RF output driver 500 (FIG. 5), RF output driver 600 (FIG. 6), RF output driver 700 (FIG. 7A), or RF output driver 701 (FIG. 7B). For purposes of clarity, a bias voltage controller is not shown but may be included in the manner described above with regard to FIG. 6.

The RF output driver 800 may include a first circuit pair 802 through an Nth circuit pair 803. That is, there may be N circuit pairs 802-803, where, as in other examples described above, N is an integer greater than or equal to two. Although for purposes of clarity only two circuit pairs 802 and 803 are individually shown, further circuit pairs that may be included are indicated by the ellipsis symbol (" . . . ") between circuit pairs 802 and 803. A reference herein to circuit pairs "802-803" refers to all N circuit pairs.

Each of the N circuit pairs 802-803 may include a first transistor 804, e.g., a MOSFET having a common gate configuration, and a second transistor 806, e.g., a MOSFET having a source follower configuration. A source terminal of first transistor 804 of each of circuit pairs 802-803 may be coupled to an input 808 of RF output driver 800. A drain terminal of first transistor 804 of each of circuit pairs 802-803 may be coupled to an output 810 of RF output driver 800 via a DC blocking capacitor 812. A gate terminal of first transistor 804 of each of circuit pairs 802-803 may be coupled via a first AC coupling capacitor 814 to ground and coupled to a respective one of N controllable bias voltage connections 816-818. A source terminal of second transistor 806 of each of circuit pairs 802-803 may be coupled to output 810 via DC blocking capacitor 812. A gate terminal of second transistor 806 of each of circuit pairs 802-803 may be coupled via a second AC coupling capacitor 820 to input 808 and coupled to a common bias voltage connection 822. Although not shown for purposes of clarity, a large impedance, such as a resistor, may be coupled between common bias voltage connection 822 and the gate terminal of second transistor 806 to help reduce interaction between the RF circuitry and the circuitry (not shown) that generates the bias voltage provided to common bias voltage connection 822. Also, although in the embodiment illustrated in FIG. 8 second AC coupling capacitor 820 is common to all N circuit pairs 802-803, in other embodiments (not shown) such an AC coupling capacitor may be included in each of the circuit pairs, and a corresponding bias voltage connection may be provided for each of the circuit pairs. Bias voltages provided to the bias voltage connections 816-818 and/or the bias voltage connection(s) 822 may be provided by the controller 612 and/or by another voltage source.

The RF output driver 800 may further include an inductor 824 configured to serve as an RF current source. Inductor 824 may be an example of current source 611 in FIG. 6. One terminal of inductor 824 may be coupled to the source terminal of first transistor 804 of each of circuit pairs 802-803, and the other terminal of inductor 824 may be coupled to ground. Second transistor 806 recycles or otherwise uses the current provided by first transistor 804.

Control circuitry, such as bias voltage controller 612 (FIG. 6), may be configured to couple one or more bias voltages in a selectable manner to controllable bias voltage connections 816-818 and thus to the gate terminal of first transistor 804 of each of the N circuit pairs 802-803. That is, bias voltage controller 612 may select a bias voltage value from a set of two or more selectable bias voltage values and apply the selected bias voltage value to any of the N controllable bias voltage connections 816-818, for example based on an input signal 616. The selectable bias voltage values may be within a range from zero (i.e., ground, although in some embodiments ground may be a voltage other than zero) to a maximum (e.g., positive) bias voltage.

Bias voltage controller 612 (FIG. 6) may select a bias voltage combination from a set of two or more selectable bias voltage combinations. Each bias voltage combination in the set may comprise a different array of N bias voltage values coupled to respective controllable bias voltage connection 816-818. In an example in which N=2, a selected bias voltage combination may comprise a first bias voltage value coupled to controllable bias voltage connection 816 and a second bias voltage value coupled to controllable bias voltage connection 818. Another bias voltage may be applied to common bias voltage connection 822. The bias voltage value applied to common bias voltage connection 822 may be based on the bias voltage value provided by one or a combination of both bias voltage values provided by controllable bias voltage connections 816 and 818. Alternatively, the bias voltage applied to common bias voltage connection 822 may be constant or fixed. That is, the same bias voltage may be applied to common bias voltage connection 822 regardless of the bias voltage combination applied to controllable bias voltage connections 816-818.

Each of the N circuit pairs 802-803 may generate a current in response to the applied bias voltages. Note that in some embodiments a bias voltage of zero (e.g., ground) at one of controllable bias voltage connections 816-818 turns off the first transistor 804 of the respective one of circuit pairs 802-803. Thus, in response to bias voltage combinations that include one or more bias voltage values of zero (e.g., ground), first transistor 804 of one or more circuit pairs 802-803 may be turned off.

The current may be proportional to the applied bias voltage. Also, the gain (Gm) that each of circuit pairs 802-803 contributes may be proportional to the current and the sizes (e.g., channel widths) of first transistor 804 and second transistor 806. Thus, the total gain of RF output driver 800 (i.e., the gain contributed by all circuit pairs 802-803 combined) may be proportional to the current and the ratio of the number of first transistors 804 that are concurrently on to those that are off (i.e., out of all N first transistors 804, the percentage or fraction that are on). For example, in an instance in which all N first transistors 804 are concurrently on, they may together have an effective size of one (unit), while in an instance in which one-half of the N first transistors 804 are concurrently on, they may together have an effective size of one-half (unit). Although in this example each of circuit pairs 802-803 may provide the same total gain as all other circuit pairs 802-803, in other examples the circuit pairs may be weighted differently from each other. For example, circuit pairs may be binary weighted.

The bias voltage combinations in the set of selectable bias voltage combinations may be configured such that the ratio of the number of first transistors 804 that are concurrently on to those that are off is inversely proportional (linearly or non-linearly) to the bias voltage value. Thus, the greater the number or percentage of first transistors 804 that are concurrently on, the lower the bias voltage or voltages. In response to each bias voltage combination in the set of selectable bias voltage combinations, circuit pairs 802-803 may collectively provide the same total gain as a result of the number of first transistors 804 that are concurrently on and the bias voltage value or values. That is, the total gain provided by RF output driver 800 may remain fixed or constant regardless of which bias voltage combination is selected and applied. Similarly, in response to each bias voltage combination in the set of selectable bias voltage combinations, circuit pairs 802-803 may collectively provide the same input impedance at input 808 and the same output impedance at output 810 as a result of the number of first transistors 804 that are concurrently on and the bias voltage value or values. That is, the input and output impedances of RF output driver 800 may remain substantially fixed or constant regardless of which bias voltage combination is selected and applied.

Figure 9:
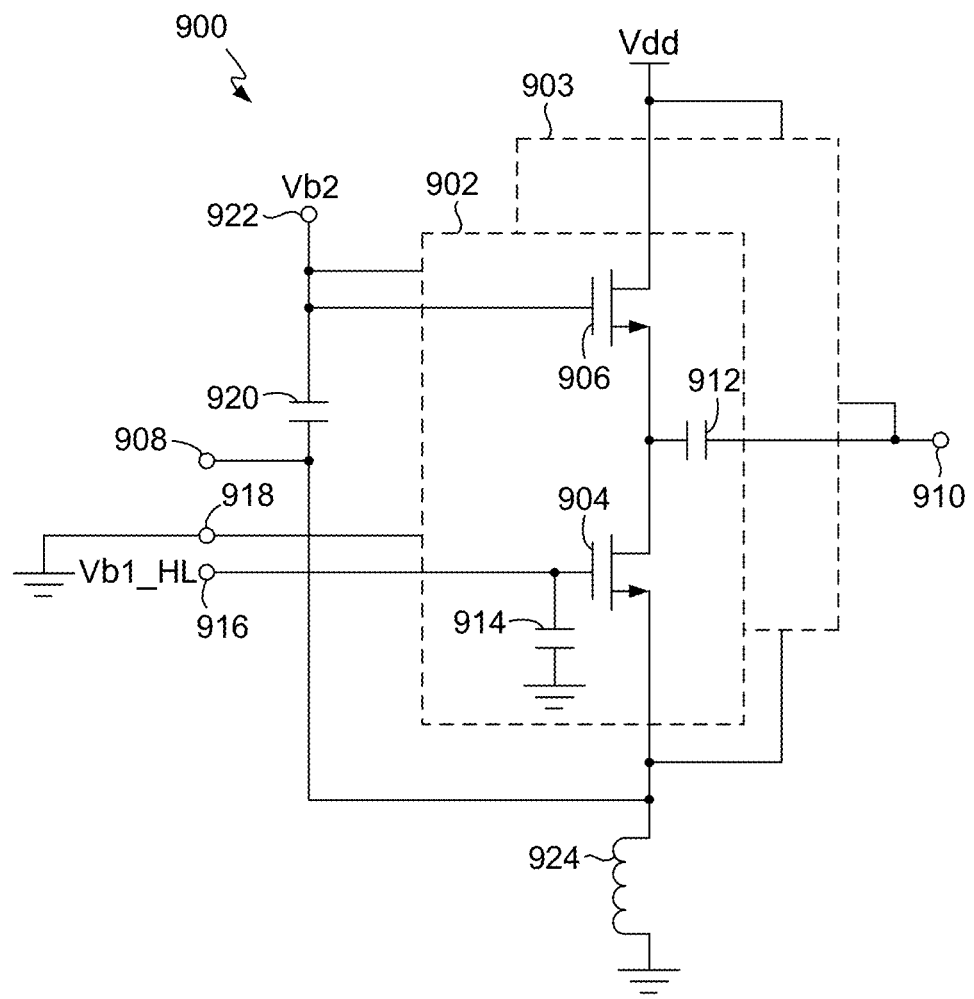
FIG. 9 is similar to FIG. 8, illustrating an exemplary 2-slice RF output driver configured in a High Linearity Mode, in accordance with various aspects of the present disclosure.
Figure 10:
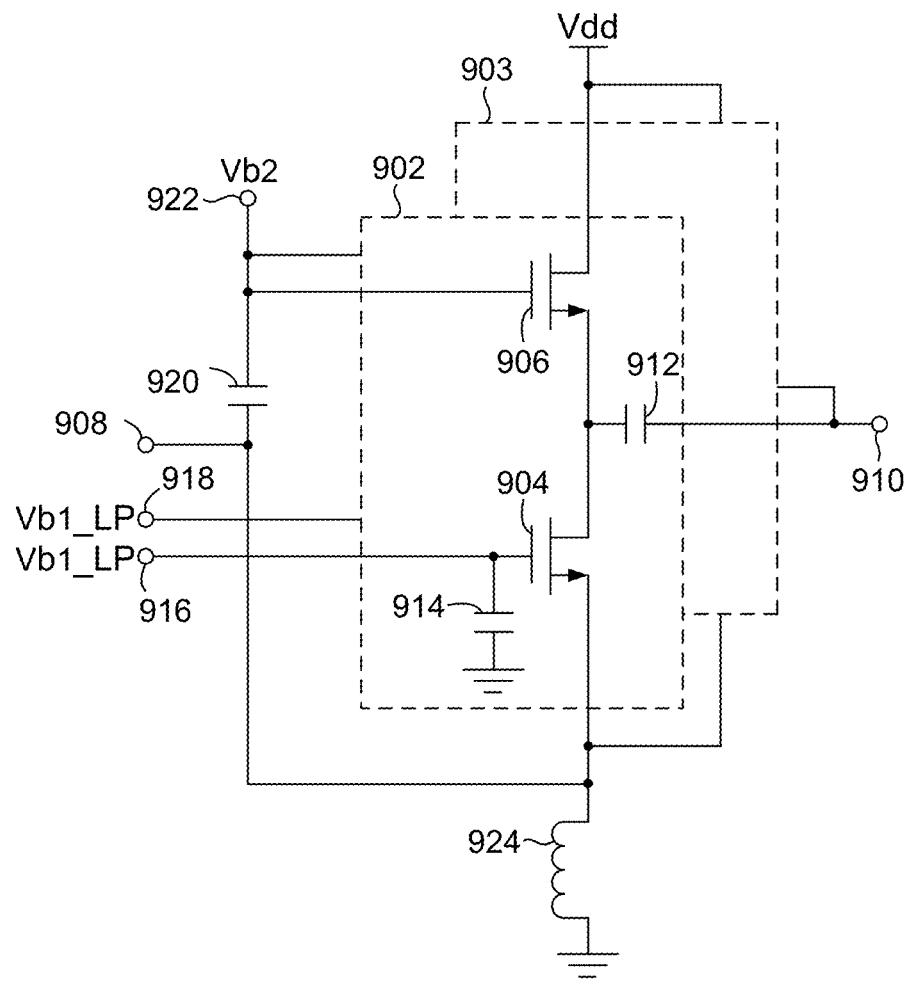
FIG. 10 is similar to FIG. 8, illustrating an exemplary 2-slice RF output driver configured in a Low Power Mode, in accordance with various aspects of the present disclosure.

FIGS. 9 and 10 are schematic circuit diagrams of an RF output driver 900. The RF output driver 900 may be an example of above-described RF output driver 800 (FIG. 8) in which N=2. That is, in this example RF output driver 900 may have exactly two circuit pairs 902 and 903. Each of circuit pairs 902 and 903 includes a first transistor 904, e.g., a MOSFET having a common gate configuration, and a second transistor 906, e.g., a MOSFET having a source follower configuration. A source terminal of first transistor 904 of each of circuit pairs 902 and 903 may be coupled to an input 908 of RF output driver 900. A drain terminal of first transistor 904 of each of circuit pairs 902 and 903 may be coupled to an output 910 of RF output driver 900 via a DC blocking capacitor 912. A gate terminal of first transistor 904 of each of circuit pairs 902 and 903 may be coupled via a first AC coupling capacitor 914 to ground and coupled directly to a respective one of two controllable bias voltage connections 916 and 918. A source terminal of second transistor 906 of each of circuit pairs 902 and 903 may be coupled to output 910 via DC blocking capacitor 912. A gate terminal of second transistor 906 of each of circuit pairs 902 and 903 may be coupled via a second AC coupling capacitor 920 to input 908 and coupled to a common bias voltage connection 922. Although not shown for purposes of clarity, a large impedance, such as a resistor, may be coupled between common bias voltage connection 922 and the gate terminal of second transistor 906 to help minimize interaction between the RF circuitry and the circuitry (not shown) that generates the bias voltage provided to common bias voltage connection 922. The RF output driver 900 may further include an inductor 924 configured in the same manner as above-described inductor 824 (FIG. 8).

Although not shown in FIGS. 9-10 for purposes of clarity, bias voltage controller 612 (FIG. 6) may select one of two bias voltage combinations in response to a corresponding one of two operating modes: a High Linearity Mode and a Low Power mode.

In the example shown in FIG. 9, when baseband processing system 210 (FIG. 2) determines that a received signal strength (not shown) is high (e.g., above a threshold), baseband processing system 210 may use Mode control signal 616 to indicate the High Linearity mode to bias voltage controller 612. In response to Mode control signal 616 indicating the High Linearity mode, bias voltage controller 612 may select a High Linearity mode bias voltage combination consisting of a first bias voltage value (Vb1_HL) coupled to controllable bias voltage connection 916, and ground (e.g., 0V) coupled to controllable bias voltage connection 918. Coupling ground to controllable bias voltage connection 918 turns off first transistor 904 of circuit pair 903.

In the example shown in FIG. 9, RF output driver 900 generates a current proportional to the applied bias voltages: the selected bias voltage value Vb1_HL that is applied to controllable bias voltage connection 816, and the fixed or constant bias voltage (Vb2) that is applied to common bias voltage connection 922.

Conversely, in the example of operation shown in FIG. 10, when baseband processing system 210 (FIG. 2) determines that a received signal strength (not shown) is low (e.g., below a threshold), baseband processing system 210 may use Mode control signal 616 to indicate the Low Power mode to bias voltage controller 612. In response to Mode control signal 616 indicating the Low Power mode, bias voltage controller 612 may select a Low Power mode bias voltage combination consisting of a second bias voltage value (Vb1_LP) coupled to both controllable bias voltage connections 816 and 818.

In the example shown in FIG. 10, RF output driver 900 generates a current proportional to the applied bias voltages: the selected bias voltage value Vb1_LP applied to controllable bias voltage connections 816 and 818, and the fixed or constant bias voltage (Vb2) applied to common bias voltage connection 922.

To provide the same amount of gain and the same input and output impedances in both the High Linearity and Low Power modes, the bias voltage values Vb1_LP and Vb1_HL may be such that the current generated in response to Vb1_LP is one-half the current generated in response to Vb1_HL. As described above with regard to FIG. 8, the total gain of RF output driver 900 (i.e., the collective gain contributed by circuit pairs 902 and 903) is proportional to the current and the ratio of the number of first transistors 904 that are concurrently on to the number that are off. Thus, in the exemplary instance of High Linearity mode operation illustrated in FIG. 9, in which there is twice the current as in FIG. 10, and in which only one of the two first transistors 904 is on (i.e., an effective transistor size of one-half), the same gain is provided as in the exemplary instance of Low Power mode operation illustrated in FIG. 10, in which there is one-half the current as in FIG. 9, and in which both of the two first transistors 904 are on (i.e., an effective transistor size of one). It should be understood that in the foregoing example the two first transistors 904 are the same size. Nevertheless, in other embodiments such transistors may differ in size. In such other embodiments, the bias voltages may be adjusted accordingly.

Although in the examples described above with regard to FIGS. 9-10 there are exactly two bias voltage combinations, in other examples (not shown) there may be more than two bias voltage combinations and/or more than two circuit pairs (i.e., N>2) to provide finer control granularity. Similarly, the terms "High Linearity" mode and "Low Power" mode are used in the examples above for illustrative purposes and should not be construed as limiting the number of modes or bias voltage combinations. In the examples above, each of the "High Linearity" and "Low Power" modes is relative to the other mode. Thus, "High Linearity" does not imply a specific linearity requirement, but rather indicates that the linearity of the output driver in that mode is higher than in the "Low Power" mode. Similarly, "Low Power" does not imply a specific power requirement, but rather indicates that the power consumed by the output driver in that mode is lower than in the "High Linearity" mode.

Figure 11:
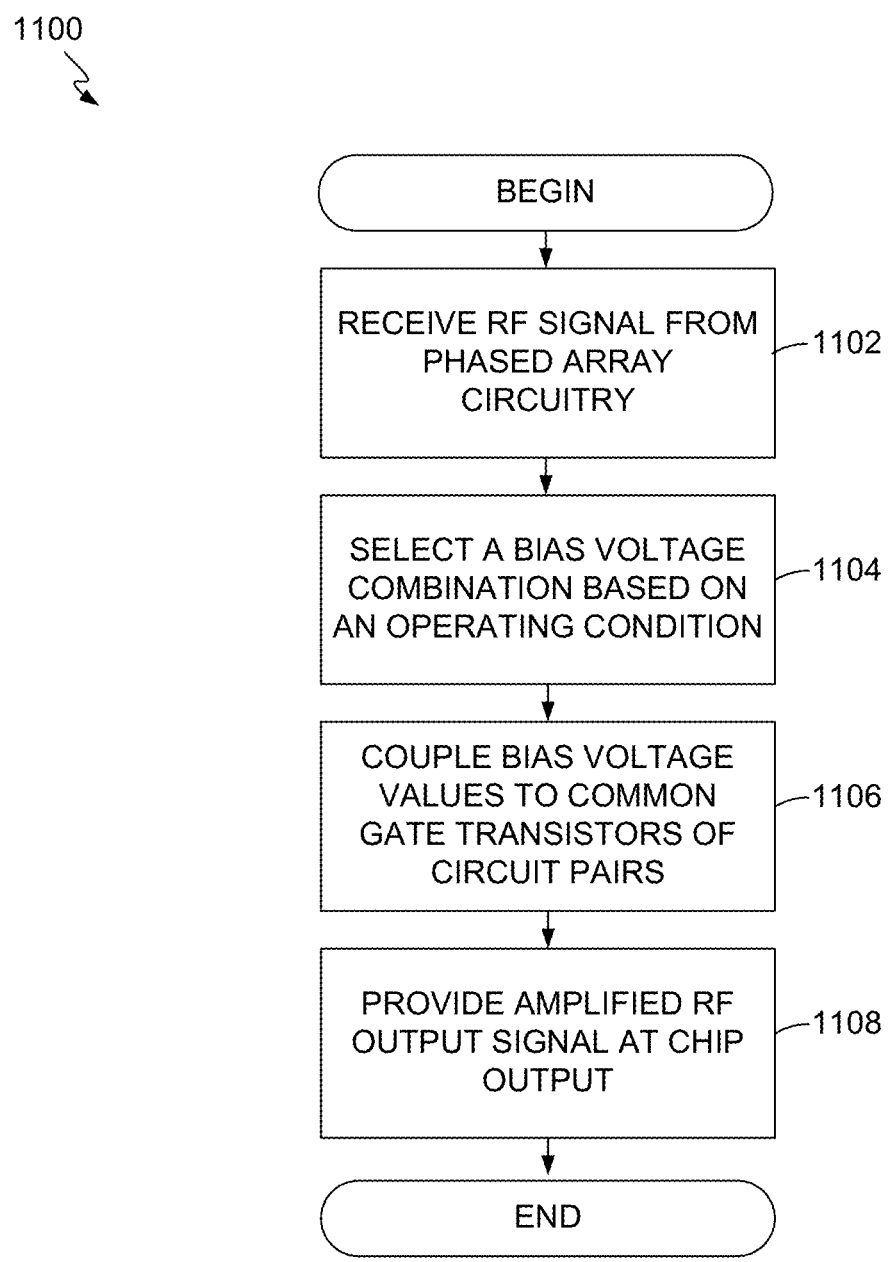
FIG. 11 is a flow diagram illustrating an example of a method for driving an RF inter-chip link, in accordance with various aspects of the present disclosure.

FIG. 11 is a flow chart illustrating an exemplary method 1100 for driving an RF inter-chip link using an RF output driver circuit, in accordance with various aspects of the present disclosure. The steps or acts in method 1100 may occur in the order indicated by the corresponding blocks in FIG. 11, or may occur in any other order not logically inconsistent with the descriptions herein, such as, for example, at least partly in parallel. In related exemplary methods, some of the steps or acts indicated by the blocks in FIG. 11 may be omitted, or additional steps or acts may be included. Also, method 1100 may be included as part of another method or combined with another method.

As indicated by block 1102, method 1100 may include receiving, at the driver circuit input, an RF signal from phased array circuitry. As indicated by block 1104, method 1100 may further include selecting one of a plurality of bias voltage combinations in response to an operating condition. The operating condition may, for example, be based on a received signal strength in relation to a threshold, or other operating condition. Each bias voltage combination may comprise a different array of bias voltage values. As indicated by block 1106, method 1100 may also include coupling a plurality of bias voltage values of the selected bias voltage combination to corresponding gate terminals of common gate transistors of a plurality of circuit pairs. Each circuit pair may comprise a source follower transistor and a common gate transistor, configured as described above. The plurality of bias voltage values may include one or more positive bias voltage values and ground (e.g., 0V). As indicated by block 1108, method 1100 may still further include providing an RF signal at the driver circuit output to a physical output port of a chip containing the phased array circuitry.

Figure 12:
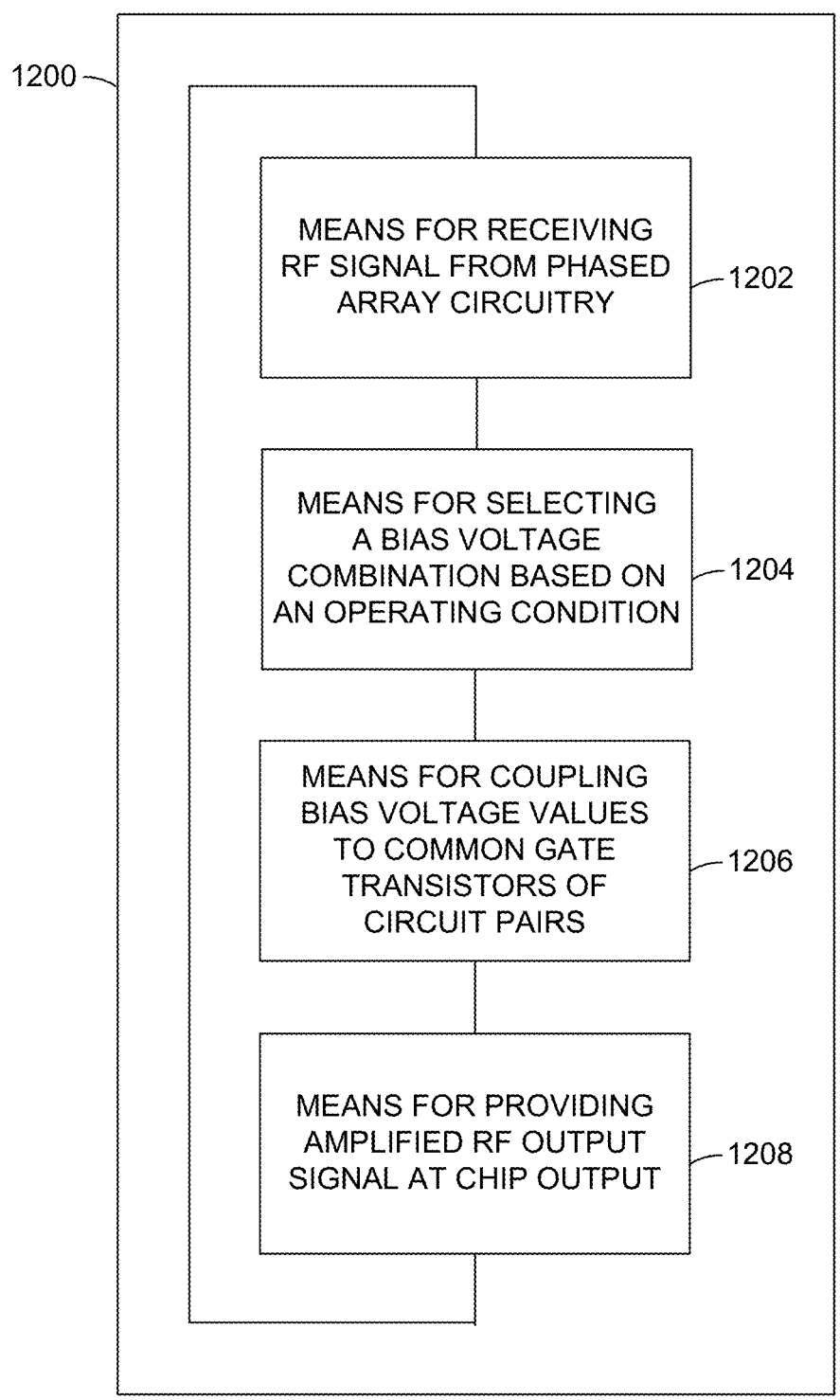
FIG. 12 is a functional block diagram illustrating an apparatus for driving an RF inter-chip link, in accordance with various aspects of the present disclosure.

FIG. 12 is a functional block diagram illustrating an apparatus 1200 for driving an RF inter-chip link, in accordance with various aspects of the present disclosure. Apparatus 1200 may comprise means 1202 for receiving an RF signal at a driver circuit input from phased array circuitry. In certain embodiments, means 1202 may be configured to perform one or more of the functions described above with regard to block 1102 (FIG. 11). Means 1202 may comprise, for example, wideband output impedance matching and gain circuit 602 and wideband input impedance matching and gain circuit 604 (FIG. 6). Apparatus 1200 may further comprise means 1204 for selecting one of a plurality of bias voltage combinations in response to an operating condition. In certain embodiments, means 1204 may be configured to perform one or more of the functions described above with regard to block 1104 (FIG. 11). Means 1204 may comprise, for example, bias voltage controller 612 (FIG. 6). Apparatus 1200 may also comprise means 1206 for coupling a plurality of bias voltage values of the selected bias voltage combination to corresponding gate terminals of common gate transistors of a plurality of circuit pairs. In certain embodiments, means 1206 may be configured to perform one or more of the functions described above with regard to block 1106 (FIG. 11). Means 1206 may comprise, for example, bias voltage controller 612 (FIG. 6) and/or the connections which couple the controller 612 to a plurality of transistors in the means 1202. Apparatus 1200 may still further comprise means 1208 for providing an RF signal at the driver circuit output to a physical output port of a chip containing the phased array circuitry. In certain embodiments, means 1208 may be configured to perform one or more of the functions described above with regard to block 1108 (FIG. 11). Means 1208 may comprise, for example, summer 606 (FIG. 6).

In the manner described above, an RF driver circuit in accordance with the present disclosure may provide benefits that include low input impedance, matched output impedance (at high radio frequencies), low current, and/or good linearity. In some embodiments, such an RF driver circuit may include features that can selectively trade off linearity with power consumption. For example, selectable modes may help optimize power consumption over a range of receive signal strengths while maintaining input/output impedance characteristics. Such an RF driver circuit may be beneficial in various contexts, including mmw (5G) WAN and gigahertz WLAN (e.g., standards such as those referred to as 60 GHz WiFi or WiGig). While certain of the embodiments described herein may provide particular advantages with respect to transmission of an RF or IF signal over a cable or link (for example, matching both an input and an output to a particular impedance such as 50 ohms, while substantially isolating the input and output from each other and providing high output power with relatively low distortion over a relatively high bandwidth, e.g., 6-12 GHz in some embodiments), implementations are not limited to such embodiments. Configurations described herein may be used to implement driver circuits in other contexts and having other benefits, or in circuits that are used to drive an inter-chip connection (e.g., interconnect) in architectures or at frequencies other than those described herein.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

The detailed description set forth above in connection with the appended drawings describes examples and does not represent the only examples that may be implemented or that are within the scope of the claims. The terms "example" and "exemplary," when used in this description, mean "serving as an example, instance, or illustration," and do not mean "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Non-transitory computer-readable media include both computer storage media and communication media including any non-transitory medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. "Disk" and "disc," as used may be herein, include compact disc (CD), laser disc, optical disc, digital versatile disc (DVD), floppy disk, and Blu-ray disc, where disks usually reproduce data magnetically, while discs reproduce data optically with lasers. Combinations of the above are also included within the scope of non-transitory computer-readable media.

The foregoing is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

Therefore, although selected aspects have been illustrated and described in detail, it will be understood that various substitutions and alterations may be made therein without departing from the spirit and scope of the present invention, as defined by the following claims.

What is claimed is:

1. A radio frequency (RF) driver circuit having a driver circuit input and a driver circuit output, comprising:
    a first transistor having a source terminal coupled to the driver circuit input and a drain terminal coupled to the driver circuit output;
    a second transistor having a source terminal coupled to the driver circuit output and a gate terminal coupled to the driver circuit input; and
    an RF current source coupled to the source terminal of the first transistor, the RF current source comprising an inductor,
    wherein the source terminal of the first transistor is coupled to the inductor, and the gate terminal of the first transistor is coupled to ground via a first capacitor, and
    wherein the drain terminal of the second transistor is coupled to a supply voltage or to ground, and the gate terminal of the second transistor is coupled to the driver circuit input via a second capacitor.

2. The RF driver circuit of claim 1, wherein the driver circuit output is coupled to an RF inter-chip link.

3. The RF driver circuit of claim 2, wherein the driver circuit input is coupled to a phased array configured to process signals received at a plurality of antennas.

4. The RF driver circuit of claim 1, wherein the first transistor and the second transistor are included in a first circuit pair of a plurality of circuit pairs, each circuit pair including a metal-oxide semiconductor field-effect transistor (MOSFET) having a gate coupled to ground via a capacitor and a source follower transistor.

5. The RF driver circuit of claim 4, further comprising a bias voltage controller circuit configured to selectably couple a bias voltage to the gate terminal of the MOSFET of each circuit pair.

6. The RF driver circuit of claim 5, wherein the controller circuit is configured to provide a plurality of bias voltage combinations, each bias voltage combination comprising a different array of bias voltage values coupled to corresponding gate terminals of the MOSFETs of the plurality of circuit pairs.

7. The RF driver circuit of claim 6, wherein the plurality of circuit pairs collectively provide a same total gain in response to all bias voltage combinations.

8. The RF driver circuit of claim 6, wherein:
a different number of MOSFETs are configured to turn on in response to a first bias voltage combination and a second bias voltage combination; and
a product of a percentage of all MOSFETs turned on and a total current among all circuit pairs produced in response to the bias voltage combinations is a constant over the first bias voltage combination and the second bias voltage combination.

9. The RF driver circuit of claim 6, wherein the bias voltage combinations comprise:
a first bias voltage combination comprising a first positive bias voltage value coupled to the gate terminal of a first one of the MOSFETs and a ground voltage value coupled to the gate terminal of a second one of the MOSFETs; and
a second bias voltage combination comprising a second positive bias voltage value lower than the first positive bias voltage value coupled to the gate terminal of the first one of the common gate transistors and the second positive bias voltage value coupled to the gate terminal of a second one of the common gate transistors.

10. A radio frequency (RF) circuit having a circuit input and a circuit output, comprising:
a wideband output impedance matching and gain circuit having an input connected to the circuit input, the wideband output impedance matching and gain circuit providing a portion of a total gain of the RF circuit;
a wideband input impedance matching and gain circuit having an input connected to the circuit input, the wideband input impedance matching and gain circuit providing a remainder of the total gain; and
a summer defining the circuit output and configured to sum an output of the wideband input impedance matching and gain circuit and an output of the wideband output impedance matching and gain circuit; and
an RF current source coupled to the wideband input impedance matching and gain circuit,
wherein the wideband input impedance matching and gain circuit comprises a first transistor having a source terminal coupled to the RF current source and to the circuit input, a drain terminal coupled to the circuit output, and a gate terminal coupled to ground via a first capacitor, and
wherein the wideband output impedance matching and gain circuit comprises a second transistor having a source terminal coupled to the circuit output, a drain terminal coupled to a voltage, and a gate terminal coupled to the circuit input via a second capacitor.

11. The RF circuit of claim 10, the wideband output impedance matching and gain circuit configured to use a current provided by the wideband input impedance matching and gain circuit.

12. The RF circuit of claim 10, wherein the RF current source comprises an inductor.

13. The RF circuit of claim 10, wherein:
the wideband output impedance matching and gain circuit is one of a plurality of wideband output impedance matching and gain circuits;
the wideband input impedance matching and gain circuit is one of a plurality of wideband input impedance matching and gain circuits, each wideband input impedance matching and gain circuit having a controllable current; and
the output of each wideband input impedance matching and gain circuit and the output of each wideband output impedance matching and gain circuit are coupled to the summer.

14. The RF circuit of claim 13, further comprising a bias voltage controller circuit configured to provide a selectable one of a plurality of bias voltage combinations to the plurality of wideband input impedance matching and gain circuits.

15. The RF circuit of claim 14, wherein each of a plurality of circuit pairs comprises one of the wideband output impedance matching and gain circuits and one of the wideband input impedance matching and gain circuits, and the plurality of circuit pairs collectively provide a same total gain in response to all bias voltage combinations.

16. The RF circuit of claim 10, wherein:
the circuit input is coupled to phased array circuitry; and
the circuit output is coupled to a physical output port of a chip containing the phased array circuitry.

17. A method for driving an RF inter-chip link, comprising:
selectably coupling a first bias voltage combination to a plurality of circuit pairs based on an operating condition in a high linearity mode, each circuit pair comprising a first transistor and a second transistor, the second transistor having a source terminal coupled to a driver circuit input, and a drain terminal coupled to a driver circuit output, the first transistor having a source terminal coupled to the driver circuit output, and a gate terminal coupled to the driver circuit input; and
selectably coupling a second bias voltage combination to the plurality of circuit pairs based on the operating condition in a low power mode,
wherein the plurality of circuit pairs collectively provide approximately a same total gain in the high linearity mode and the low power mode.

18. The method of claim 17, wherein selectably coupling the first bias voltage combination comprises
coupling a first bias voltage to the gate terminals of a subset of the common gate transistors in the plurality of circuit pairs and coupling the gate terminals of remaining common gate transistors in the plurality of circuit pairs to ground in the high linearity mode; and
wherein selectably coupling the second bias voltage combination comprises coupling a second bias voltage to the gate terminals of a set of the common gate transistors in the plurality of circuit pairs in the low power mode, a quantity of the common gate transistors in the subset being less than a quantity of the common gate transistors in the set, and the first bias voltage being higher than the second bias voltage.

19. The method of claim 18, wherein the operating condition comprises a signal strength of a received signal, wherein the high linearity mode corresponds to the signal strength being above a threshold, and wherein the low power mode corresponds to the signal strength being below the threshold.

20. The method of claim 17, further comprising:
receiving, at the driver circuit input, an RF signal from phased array circuitry of a 5G or WiGig communication device; and
providing an output signal at the driver circuit output to a physical output port of a chip containing the phased array circuitry.

21. An apparatus for driving an RF inter-chip link, comprising:
a plurality of circuit pairs, each circuit pair comprising:
a first transistor having a source terminal coupled to an output of the apparatus and a gate terminal coupled to an input of the apparatus; and
a second transistor having a source terminal coupled to the input and a drain terminal coupled to the output; and
means for selectably coupling a bias voltage combination to the plurality of circuit pairs such that the plurality of circuit pairs collectively provide approximately a same total gain in a high linearity mode and a low power mode.

22. The apparatus of claim 21, wherein the means for selectably coupling a bias voltage combination comprises:
means for selecting one of a plurality of bias voltage combinations, each bias voltage combination comprising a different array of bias voltage values; and
means for coupling a plurality of bias voltage values of a selected bias voltage combination to corresponding gate terminals of the second transistors.

23. The apparatus of claim 21, wherein the means for selectably coupling a bias voltage combination comprises:
means for coupling a first positive bias voltage value to the gate terminal of a first one of the second transistors and ground to the gate terminal of a second one of the second transistors in a first mode; and
means for coupling a second positive bias voltage value lower than the first positive bias voltage value to the gate terminal of the first one of the second transistors and the second positive bias voltage value to the gate terminal of the second one of the second transistors in a second mode.

24. The apparatus of claim 21, further comprising:
means for receiving, at the input, an RF signal from phased array circuitry; and
means for providing an output signal at the output to a physical output port of a chip containing the phased array circuitry.

* * * * *